United States Patent
Chen et al.

(10) Patent No.: US 11,049,881 B2
(45) Date of Patent: Jun. 29, 2021

(54) METHOD FOR MANUFACTURING A TOP-GATE SELF-ALIGNED INDIUM-TIN-ZINC OXIDE THIN-FILM TRANSISTOR

(71) Applicant: South China University of Technology, Guangzhou (CN)

(72) Inventors: Rongsheng Chen, Guangzhou (CN); Sunbin Deng, Guangzhou (CN); Hoising Kwok, Guangzhou (CN)

(73) Assignee: SOUTH CHINA UNIVERSITY OF TECHNOLOGY, Guangdong (CN)

(*) Notice: Subject to any disclaimer, the term of this patent is extended or adjusted under 35 U.S.C. 154(b) by 0 days.

(21) Appl. No.: 16/633,206

(22) PCT Filed: Oct. 19, 2017

(86) PCT No.: PCT/CN2017/106778
§ 371 (c)(1),
(2) Date: Jan. 23, 2020

(87) PCT Pub. No.: WO2019/047336
PCT Pub. Date: Mar. 14, 2019

(65) Prior Publication Data
US 2020/0258916 A1    Aug. 13, 2020

(30) Foreign Application Priority Data
Sep. 5, 2017 (CN) .......................... 201710792095.9

(51) Int. Cl.
*H01L 27/00* (2006.01)
*H01L 29/00* (2006.01)
(Continued)

(52) U.S. Cl.
CPC .... *H01L 27/1225* (2013.01); *H01L 21/02554* (2013.01); *H01L 27/127* (2013.01); *H01L 27/1248* (2013.01); *H01L 27/1251* (2013.01)

(58) Field of Classification Search
CPC .............. H01L 27/127; H01L 27/1225; H01L 27/1251; H01L 27/1248; H01L 29/7869;
(Continued)

(56) References Cited

U.S. PATENT DOCUMENTS 9,184,160 B2 * 11/2015 Yamazaki ......... H01L 29/66969
9,525,074 B2 * 12/2016 Kim .................. H01L 29/78606
(Continued)

FOREIGN PATENT DOCUMENTS

| CN | 103311128 | 9/2013 |
| CN | 105006487 | 10/2015 |
| CN | 106128944 | 11/2016 |

OTHER PUBLICATIONS

Search Report for Application No. PCT/CN2017/106778, dated Jun. 1, 2018, Intellectual Property Office of the P.R. China, Beijing, CN.
(Continued)

*Primary Examiner* — Nikolay K Yushin
(74) *Attorney, Agent, or Firm* — B. Aaron Schulman, Esq.; Stites & Harbison, PLLC

(57) ABSTRACT

The TG-SA ITZO TFT comprises a substrate, a buffer layer, an ITZO thin film, a gate dielectric layer, a conductive thin film, a passivation layer, gate, source and drain contact electrodes. The transistor has a TG-SA structure, which can address the issues of larger parasitic capacitance and weaker device scalability in a traditional bottom-gate counterpart. When depositing the gate dielectric layer and the passivation layer, different gas sources and annealing conditions are used, such that the ITZO thin film region contacted with and covered by the gate dielectric layer shows a high-resistivity
(Continued)

state, the ITZO thin film region contacted with and covered by the passivation layer shows a low-resistivity state, thereby forming a high-resistivity channel region and low-resistivity conductive source and drain regions, and addressing the thermal instability issue.

7 Claims, 3 Drawing Sheets

(51) Int. Cl.
    *H01L 27/12*     (2006.01)
    *H01L 21/02*     (2006.01)
    *H01L 21/00*     (2006.01)

(58) Field of Classification Search
    CPC ........... H01L 29/66969; H01L 29/4908; H01L 29/45; H01L 21/02554; H01L 21/02631; H01L 21/465; H01L 21/707
    See application file for complete search history.

(56) References Cited

U.S. PATENT DOCUMENTS

2013/0193433 A1*   8/2013   Yamazaki ......... H01L 29/66969
                                                                                  257/43
2016/0225907 A1    8/2016   Kim et al.

OTHER PUBLICATIONS

Written Opinion for Application No. PCT/CN2017/106778, dated Jun. 1, 2018, Intellectual Property Office of the P.R. China, Beijing, CN.

* cited by examiner

METHOD FOR MANUFACTURING A TOP-GATE SELF-ALIGNED INDIUM-TIN-ZINC OXIDE THIN-FILM TRANSISTOR

FIELD OF THE INVENTION

The present disclosure relates to the technical field of semiconductors, and more particularly, to a top-gate self-aligned (TGSA) indium-tin-zinc oxide (ITZO) thin-film transistor (TFT) and manufacturing method thereof.

BACKGROUND OF THE INVENTION

Explanation of Terms

Precursor: refers to a precursor or a raw material for synthesizing some substance.

With the development of next-generation active-matrix organic-light-emitting-diode (AMOLED) display technology, metal oxide thin-film transistor (TFTs) have attracted great attention and been intensively studied, wherein bottom-gate ITZOTFTs are one of the most representative example. However, the bottom-gate devices suffer from large parasitic capacitance and weak device scalability, thus being unfriendly to high-resolution displays and system-on-panel (SOP) technology. So far, some of research groups have developed a type of top-gate self-aligned (TG-SA) TFTs with smaller parasitic capacitance and stronger device scalability. However, their highly conductive source and drain regions are often formed via hydrogen (J. Park et. al, Appl. Phys. Lett., 93, 053501, 2008) or argon (B. Du Ahn et. al, Appl. Phys. Lett., 93, 203506, 2008) plasma treatment, where doped ions are able to easily diffuse from source and drain regions to channels, resulting in the over conductive channels and the devices without switching behavior. Particularly, such diffusion can be accelerated by the following thermal treatments. Therefore, these TFTs with the plasma-treated source and drain regions often show poor thermal stability. Moreover, the formation of highly conductive source and drain regions by doping ions involves additional process steps, which increase manufacturing cost.

SUMMARY OF THE INVENTION

In order to solve the technical problems above, the first object of the present disclosure is to provide a TG-SA ITZO TFT with small parasitic capacitance and strong and strong device scalability.

The second object of the present disclosure is to provide a TG-SA ITZO TFT with small parasitic capacitance, strong device scalability, robust thermal stability and low manufacturing cost.

The first technical solution adopted in the present disclosure is as follows.

A TG-SA ITZO TFT comprises a substrate; a buffer layer provided on the substrate; an ITZO thin film provided on the buffer layer, wherein the ITZO thin film comprises one low-resistivity source region, one low-resistivity drain region and one high-resistivity channel region; a gate dielectric layer provided on the ITZO thin film; a conductive thin film provided on the gate dielectric layer; a passivation layer covered on the conductive thin film and the ITZO thin film; source and drain contact electrodes provided on the ITZO thin film, wherein the source and drain contact electrodes are in ohmic contact with the ITZO thin film through a contact hole in the passivation layer; and a gate contact electrode provided on the conductive thin film, wherein the gate contact electrode is contacted with the conductive thin film through the contact hole in the passivation layer.

Further, the buffer layer is a silicon dioxide layer, a silicon nitride layer or a stacked layer of silicon dioxide and silicon nitride.

Further, the gate dielectric layer is a silicon dioxide layer, a combination of a silicon dioxide layer and a silicon nitride layer, or a combination of a silicon dioxide layer and an aluminum oxide layer; and the passivation layer is a silicon dioxide layer, a combination of a silicon dioxide layer and a silicon nitride layer, or a combination of a silicon dioxide layer and an aluminum oxide layer.

Further, the source and drain contact electrodes, the gate electrode and the conductive thin film are all composed of metal and/or conductive metal oxide.

The second technical solution adopted in the present disclosure is as follows.

A method for manufacturing a TG-SA ITZO TFT, comprises the following steps of:
 depositing a buffer layer on a substrate;
 depositing an ITZO thin film on the buffer layer;
 patterning and etching the ITZO thin film to obtain a patterned ITZO thin film;
 depositing a gate dielectric layer on the patterned ITZO thin film by using a first chemical vapor deposition method, wherein a precursor used in the first chemical vapor deposition method comprises alkoxysilane or a mixed gas source of alkoxysilane and inert gas, and a first oxidizing gas source;
 depositing a conductive thin film on the gate dielectric layer, and patterning and etching the conductive thin film to obtain a patterned conductive thin film;
 etching the gate dielectric layer by using the patterned conductive thin film as a mask, and performing first annealing;
 depositing a passivation layer on the conductive thin film and the ITZO thin film by using a second chemical vapor deposition method, wherein a gas source used in the second chemical vapor deposition method comprises a silane gas source or a mixed gas source of silane and inert gas, and a second oxidizing gas source;
 patterning and etching the passivation layer to form contact holes of a source, a drain and a gate; and
 forming source, drain and gate contact electrodes in the contact holes of the source, the drain and the gate.

Further, the specific step of depositing the ITZO thin film on the buffer layer is:
 depositing the ITZO thin film on the buffer layer by using a magnetron sputtering method, wherein the magnetron sputtering method is a direct-current (DC) magnetron sputtering method and/or a radio-frequency (RF) magnetron sputtering method; an ITO target material and a ZnO target material are used as target materials in the magnetron sputtering method; and a temperature of the substrate during the reaction ranges from 23° C. to 400° C.

Further, the first oxidizing gas source is $O_2$, $O_3$, $N_2O$ or a mixed gas containing oxygen, and the second oxidizing gas source is $O_2$, $O_3$, $N_2O$ or a mixed gas containing oxygen.

Further, the alkoxysilane is trimethoxysilane, ethyl orthosilicate, triethoxysilane or tetramethyl silicate.

Further, in the first annealing, an annealing atmosphere is a gas containing oxygen, an annealing temperature ranges from 100° C. to 400° C., and the annealing lasts for 1 hour to 4 hours.

Further, in the second annealing, an annealing atmosphere is a gas containing oxygen, an annealing temperature ranges from 100° C. to 400° C., and the annealing lasts for 0.1 hour to 2 hours.

The transistor of the present disclosure has the beneficial effects that: the transistor comprises the substrate, the buffer layer, the ITZO thin film, the gate dielectric layer, the conductive thin film, the passivation layer, the gate, source and drain contact electrodes; and the transistor has a TG-SA structure, which can overcome the problems of large parasitic capacitance and weak device scalability in a traditional bottom-gate ITZO TFT. Moreover, the transistor of the present disclosure has the advantages of small parasitic capacitance and strong device scalability.

The method of the present disclosure has the beneficial effects that: the method comprises the following step: depositing the gate dielectric layer on the patterned ITZO thin film by using the first chemical vapor deposition method; etching the gate dielectric layer by using the patterned conductive thin film as the mask, and performing the first annealing; depositing the passivation layer on the conductive thin film and the ITZO thin film by using the second chemical vapor deposition method; and performing the second annealing. The precursor used in the first chemical vapor deposition method comprises the alkoxysilane or the mixed gas source of alkoxysilane and inert gas, and the first oxidizing gas source, so that a part of the ITZO thin film contacted with and covered by the gate dielectric layer shows a high-resistivity state after the first annealing, thereby becoming a high-resistivity channel region of the transistor. The gas source used in the second chemical vapor deposition method comprises the silane gas source or the mixed gas source of silane and inert gas, and the second oxidizing gas source, so that a part of the ITZO thin film contacted with and covered by the passivation layer shows a low-resistivity state after the second annealing, thereby becoming low-resistivity source and drain regions. Therefore, the extra processes of forming the highly conductive source and drain regions by doping ions in the traditional method is omitted, thereby reducing the production cost. Meanwhile, the thermal instability issue of the general TG-SA ITZO TFTs is solved. The ITZO TFT manufactured by the method of the present disclosure has a TG-SA structure, which can overcome the issue of large parasitic capacitance and weak device scalability present in a traditional bottom-gate ITZO TFT. Moreover, ITZO TFT of the present disclosure has the advantages of small parasitic capacitance and strong device scalability.

DETAILED DESCRIPTION OF THE EMBODIMENTS

Figure 1:
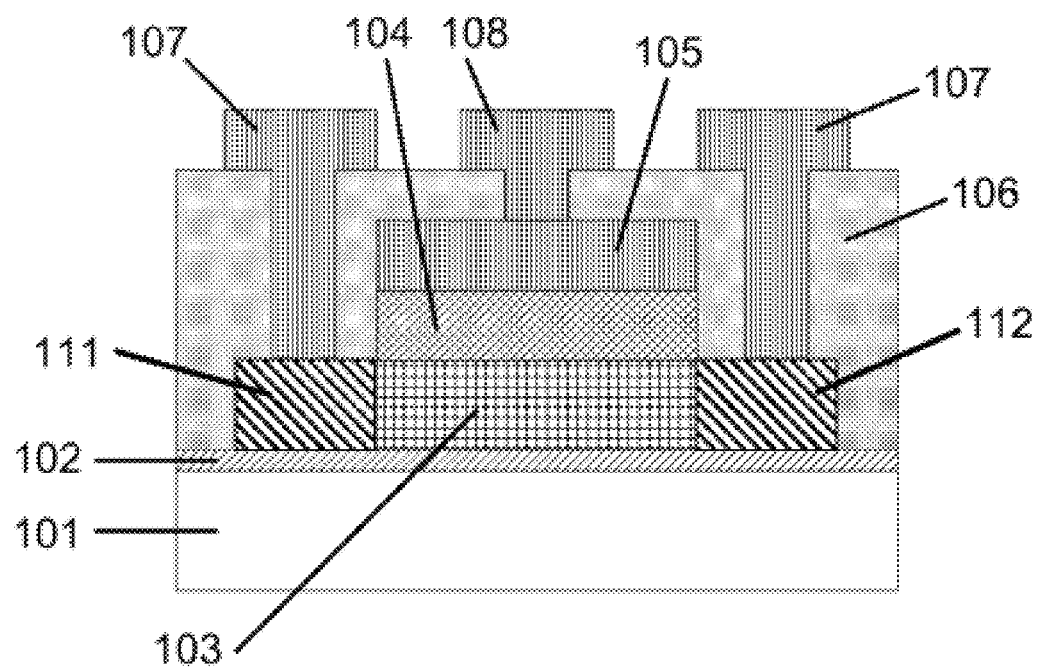
FIG. 1 is a cross-sectional view of a TG-SA ITZO TFT of the present disclosure.

With reference to FIG. 1, a TG-SA ITZO TFT comprises a substrate 101; a buffer layer 102 provided on the substrate 101; an ITZO thin film 103 provided on the buffer layer 102, wherein the ITZO thin film 103 comprises two low-resistivity source and drain regions (a first low-resistivity source and drain region 111, and a second low-resistivity source and drain region 112) and one high-resistivity channel region; a gate dielectric layer 104 provided on the ITZO thin film 103; a conductive thin film 105 provided on the gate dielectric layer 104; a passivation layer 106 covered on the conductive thin film 105 and the ITZO thin film 103; source and drain contact electrodes 107 provided on the ITZO thin film 103, wherein the source and drain contact electrodes 107 are in ohmic contact with the ITZO thin film 103 through a contact hole in the passivation layer 106; and a gate contact electrode 108 provided on the conductive thin film 105, wherein the gate contact electrode 108 is contacted with the conductive thin film 105 through the contact hole in the passivation layer 106.

Further, as a preferred embodiment, the buffer layer 102 is a silicon dioxide layer, a silicon nitride layer or a stacked layer of silicon dioxide and silicon nitride.

Further, as a preferred embodiment, the gate dielectric layer 104 is a silicon dioxide layer, a combination of a silicon dioxide layer and a silicon nitride layer, or a combination of a silicon dioxide layer and an aluminum oxide layer; and the passivation layer 106 is a silicon dioxide layer, a combination of a silicon dioxide layer and a silicon nitride layer, or a combination of a silicon dioxide layer and an aluminum oxide layer.

Further, as a preferred embodiment, the source and drain contact electrodes 107, the gate contact electrode 108 and the conductive thin film 105 are all composed of metal and/or conductive metal oxide.

With reference to FIG. 1 to FIG. 7, a method for manufacturing a TG-SA ITZO TFT comprises the following steps of:

depositing a buffer layer 102 on a substrate 101;

depositing an ITZO thin film 103 on the buffer layer 102;

patterning and etching the ITZO thin film 103 to obtain a patterned ITZO layer 103;

depositing a gate dielectric layer 104 on the patterned ITZO thin film 103 by using a first chemical vapor deposition method, wherein a precursor used in the first chemical vapor deposition method comprises alkoxysilane or a mixed gas source of alkoxysilane and inert gas, and a first oxidizing gas source;

depositing a conductive thin film 105 on the gate dielectric layer 104, and patterning and etching the conductive thin film 105 to obtain a patterned conductive thin film 105;

etching the gate dielectric layer 104 by using the patterned conductive thin film 105 as a mask, and performing first annealing;

depositing a passivation layer 106 on the conductive thin film 105 and the ITZO thin film 103 by using a second chemical vapor deposition method, wherein a gas source used in the second chemical vapor deposition method comprises a silane gas source or a mixed gas source of silane and inert gas, and a second oxidizing gas source; as a preferred embodiment, the inert gas is nitrogen, helium and argon;

patterning and etching the passivation layer 106 to form contact holes of a source, a drain and a gate; and forming source and drain contact electrodes 107 and a gate contact electrode 108 in the contact holes of the source, the drain and the gate, and performing second annealing.

Further, as a preferred embodiment, the specific step of depositing the ITZO thin film 103 on the buffer layer 102 is: depositing the ITZO thin film 103 on the buffer layer by using a magnetron sputtering method, wherein the magnetron sputtering method is a DC magnetron sputtering method and/or a RF magnetron sputtering method; an ITO target material and a ZnO target material are used as target materials in the magnetron sputtering method; and a temperature of the substrate during the reaction ranges from 23° C. to 400° C.

Further, as a preferred embodiment, the first oxidizing gas source is $O_2$, $O_3$, $N_2O$ or a mixed gas containing oxygen; and the second oxidizing gas source is $O_2$, $O_3$, $N_2O$ or a mixed gas containing oxygen.

Further, as a preferred embodiment, the alkoxysilane is trimethoxysilane, ethyl orthosilicate, triethoxysilane or tetramethyl silicate, and as a preferred embodiment, the inert gas is nitrogen, helium and argon.

Further, as a preferred embodiment, in the first annealing, an annealing atmosphere is a gas containing oxygen, an annealing temperature ranges from 100° C. to 400° C., and the annealing lasts for 1 hour to 4 hours. The gas containing oxygen may be pure oxygen, a mixed gas of oxygen and argon, a mixed gas of oxygen and helium, or air.

Further, as a preferred embodiment, in the second annealing, an annealing atmosphere is a gas containing oxygen, an annealing temperature ranges from 100° C. to 400° C., and the annealing lasts for 0.1 hour to 2 hours. The gas containing oxygen may be pure oxygen, a mixed gas of oxygen and argon, a mixed gas of oxygen and helium, or air.

The present disclosure is further described hereinafter with reference to the drawings and the specific embodiments.

Embodiment 1

With reference to FIG. 1, a TG-SA ITZO TFT comprises a substrate 101; a buffer layer 102 provided on the substrate 101, wherein the buffer layer 102 is composed of silicon dioxide; an ITZO thin film 103 provided on the buffer layer 102, wherein the ITZO thin film 103 comprises two low-resistivity source and drain regions (a first low-resistivity source and drain region 111, and a second low-resistivity source and drain region 112) and one high-resistivity channel region; a gate dielectric layer 104 provided on the ITZO thin film 103, wherein the gate dielectric layer 104 is composed of silicon dioxide; a conductive thin film 105 provided on the gate dielectric layer 104, wherein the conductive thin film 105 is composed of metallic aluminum; a passivation layer 106 provided on the conductive thin film 105, wherein the passivation layer 106 is composed of silicon dioxide and comprises two contact holes of a source and a drain and one contact hole of a gate, the conductive thin film 105 and parts of the ITZO thin film 103 not covered by the gate dielectric layer 104 are both covered by the passivation layer 106; source and drain contact electrodes 107 arranged in the two contact holes of the source and the drain, wherein the two source and drain contact electrodes 107 are respectively in ohmic contact with two low-resistivity source and drain regions (a first low-resistivity source and drain region 111 and a second low-resistivity source and drain region 112); and a gate contact electrode 108 arranged in the contact hole of the gate, wherein the gate contact electrode 108 is contacted with the conductive thin film 105.

The substrate 101 is a silicon substrate or a glass substrate; the buffer layer 102 may also be a silicon nitride layer or a stacked layer of silicon dioxide and silicon nitride; the gate dielectric layer may also be a combination of a silicon dioxide layer and a silicon nitride layer (a combination of a silicon dioxide layer and a silicon oxynitride layer, or a combination of a silicon dioxide layer and an aluminum oxide layer), wherein the silicon dioxide layer needs to be directly contacted with the ITZO thin film 103; and the conductive thin film 105, the source and drain contact electrodes 107, and the gate contact electrode 108 may be composed of metal and/or conductive metal oxide, wherein the metal may be aluminum, titanium, molybdenum, copper, other metals or their stacks, and the conductive metal oxide may be ITO, FTO, other conductive metal oxides or their stacks. For example, the source and drain contact electrodes 107 are pure aluminum electrodes or electrodes formed by stacking a molybdenum thin film and an aluminum thin film. For example, the conductive thin film 105 may be a thin film formed by stacking a molybdenum thin film and an aluminum thin film.

Embodiment 2

Figure 2:
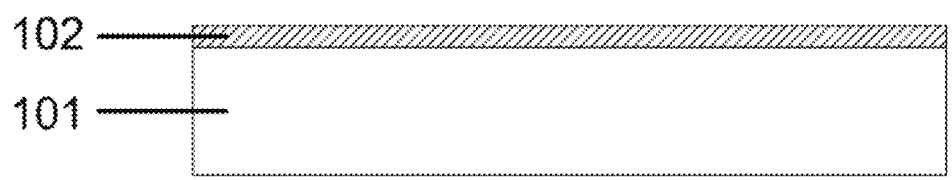
FIG. 2 is a cross-sectional view of Embodiment 2 of the present disclosure after forming a buffer layer on a substrate.
Figure 3:
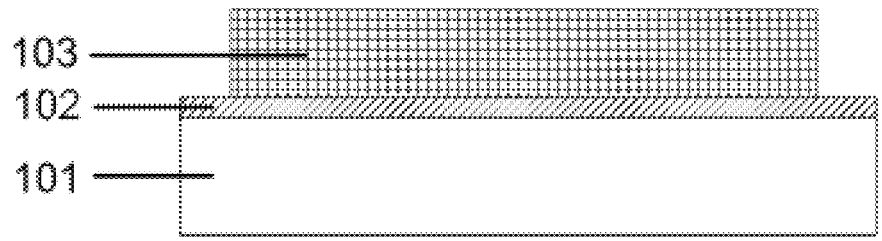
FIG. 3 is a cross-sectional view of Embodiment 2 of the present disclosure after depositing an ITZO thin film on the buffer layer.
Figure 4:
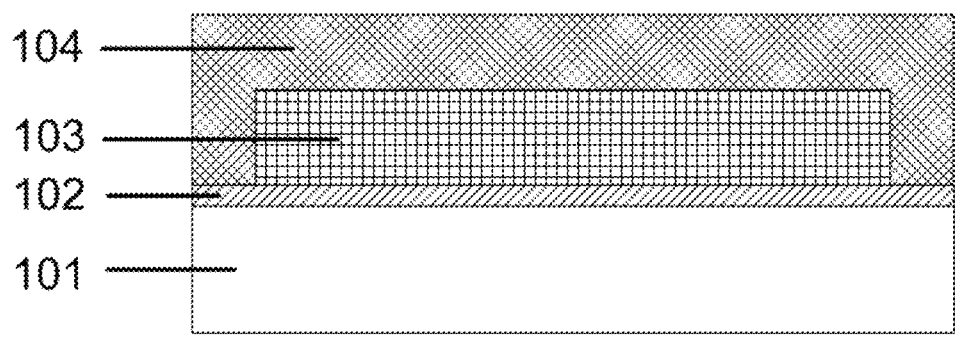
FIG. 4 is a cross-sectional view of Embodiment 2 of the present disclosure after depositing a gate dielectric layer on the ITZO thin film.
Figure 5:
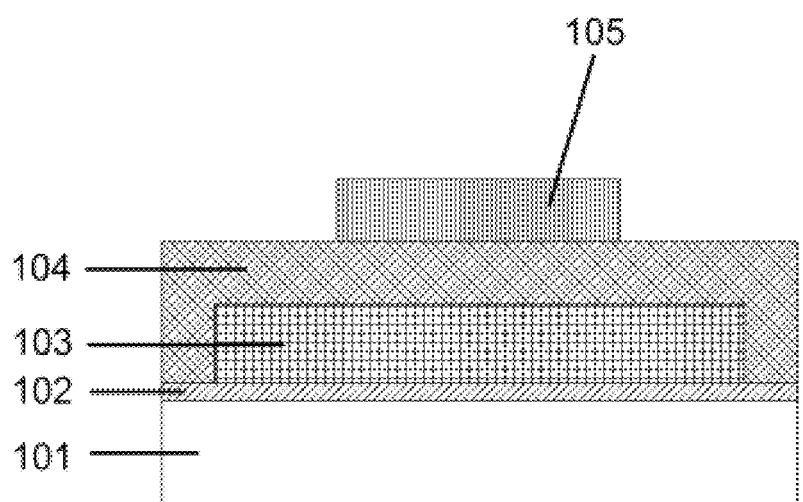
FIG. 5 is a cross-sectional view of Embodiment 2 of the present disclosure after depositing a conductive thin film on the gate dielectric layer and patterning the conductive thin film.
Figure 6:
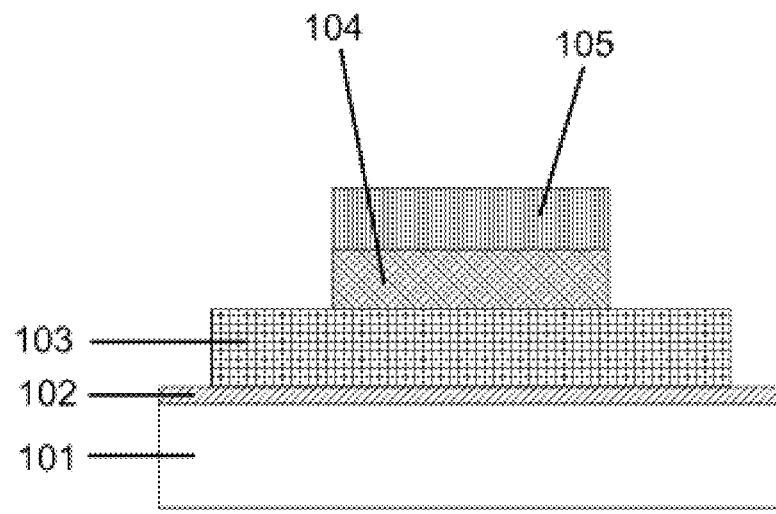
FIG. 6 is a cross-sectional view of Embodiment 2 of the present disclosure after etching the gate dielectric layer.
Figure 7:
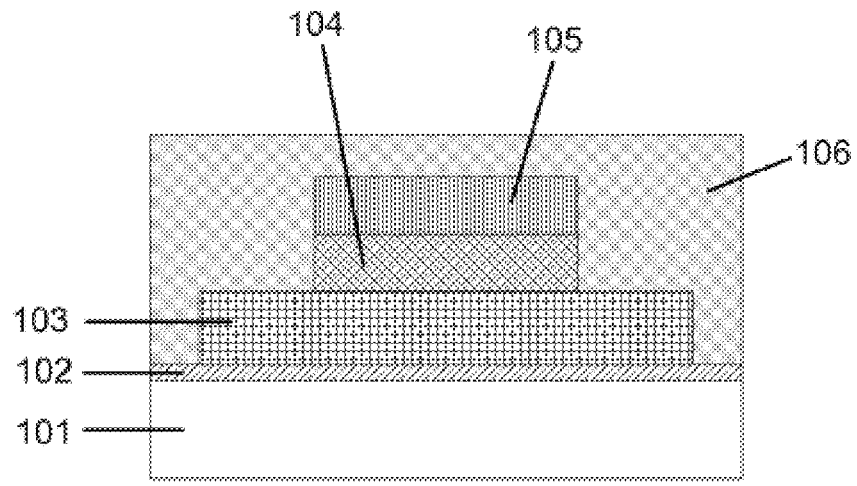
FIG. 7 is a cross-sectional view of Embodiment 2 of the present disclosure after depositing a passivation layer by using a chemical vapor deposition method.

With reference to FIG. 1 to FIG. 7, a method for manufacturing a TG-SA ITZO TFT comprises the following steps:

S1, depositing a buffer layer 102 on a substrate 101 by using a thermal oxidation method, as shown in FIG. 2;

S2, depositing an ITZO thin film 103 on the buffer layer 102 by using a magnetron sputtering method, as shown in FIG. 3; wherein the magnetron sputtering method is a DC magnetron sputtering method and a RF magnetron sputtering method, and an ITO target material and a ZnO target material are used as target materials in the magnetron sputtering method; a DC power supply is used when the ITO target material is sputtered, and an input power of the DC power supply is 120 W; a RF power supply is used when the ZnO target material is sputtered, and an input power of the RF power supply is 150 W; a reaction atmosphere is oxygen and argon, and a working pressure is 3 mTorr;

S3, performing photolithography and wet etch on the ITZO thin film 103 to pattern the ITZO thin film 103; S4, depositing silicon dioxide on the patterned ITZO thin film 103 as the gate dielectric layer 104 by using a plasma enhanced chemical vapor deposition (PECVD) method, as shown in FIG. 4; wherein, a reaction precursor of the PECVD method is tetraethyl orthosilicate (TEOS), gases introduced during the reaction also comprises $N_2O$, $O_2$ and Ar, a reaction temperature is 300° C., a reaction pressure is 220 mTorr, and an input power during the reaction is 30 W;

S5, depositing an aluminum thin film on the gate dielectric layer 104 as the conductive thin film 105 by using a magnetron sputtering method, as shown in FIG. 5, and performing photolithography and dry etch on the aluminum thin film to pattern the conductive thin film 105;

S6, etching the gate dielectric layer 104 by using the patterned conductive thin film 105 as a mask, to expose the source and drain regions of the ITZO thin film 103 and form a self-aligned structure, as shown in FIG. 6;

S7, after completing the etching of the gate dielectric layer 104, performing a first annealing at a temperature of 300° C. for 2 hours; wherein an annealing atmosphere is oxygen;

S8, depositing silicon dioxide on the conductive thin film 105 and the exposed source and drain regions of the ITZO thin film 103 as a passivation layer 106 by using a PECVD method, as shown in FIG. 7; wherein a reaction gas source is silane, gases introduced during the reaction also comprises $N_2O$ and $N_2$, a reaction temperature is 300° C., an input power during the reaction is 60 W, and a reaction pressure is 900 mTorr;

S9, patterning and etching the passivation layer 106 to form contact holes of a source, a drain and a gate;

S10, depositing an aluminum thin film by using a magnetron sputtering method; wherein the aluminum thin film may cover the passivation layer 106, and metal aluminum can be deposited into the contact holes of the source, the drain and the gate; then performing photolithography and dry wet on the aluminum thin film covered on the passivation layer 106 to form source and drain contact electrodes 107 and a gate contact electrode 108, as shown in FIG. 1;

S11, performing second annealing at 300° C. for 2 hours; wherein an annealing atmosphere is oxygen.

TABLE 1

|  | Mobility ($cm^2/Vs$) | Sub-threshold swing (V/dec) | Threshold voltage (V) |
| --- | --- | --- | --- |
| Embodiment 2 | 16 | 0.09 | −1.75 |
| Document 1 | 12 | 0.1 | −1 |
| Document 2 | 12 | 0.1 | 3.5 |
| Document 3 | 7.27 | 0.49 | 0.96 |

It can be seen from Table 1 that the TG-SA ITZO TFT manufactured in Embodiment 2 has the advantages of high mobility, steep sub-threshold swing, low threshold voltage, and the like, relative to the ITZO TFTs in Document 1 (Manoj Nag et al., "Circuits and AMOLED display with self-aligned a-IGZO TFTs on polyimide foil", Journal of the Society for Information Display, 22(10), pp. 509-517, 2014), Document 2 (R. Chen et al., "Self-Aligned Indium-Gallium-Zinc Oxide Thin-Film Transistor With Source/Drain Regions Doped by Implanted Arsenic", 34(1), pp. 60-62, 2013) and Document 3 (B. Du Ahn et al., "Comparison of the effects of Ar and $H_2$ plasmas on the performance of homojunctioned amorphous indium gallium zinc oxide thin film transistors," Appl. Phys. Lett., 93(20), p. 203506, 2008).

Figure 8:
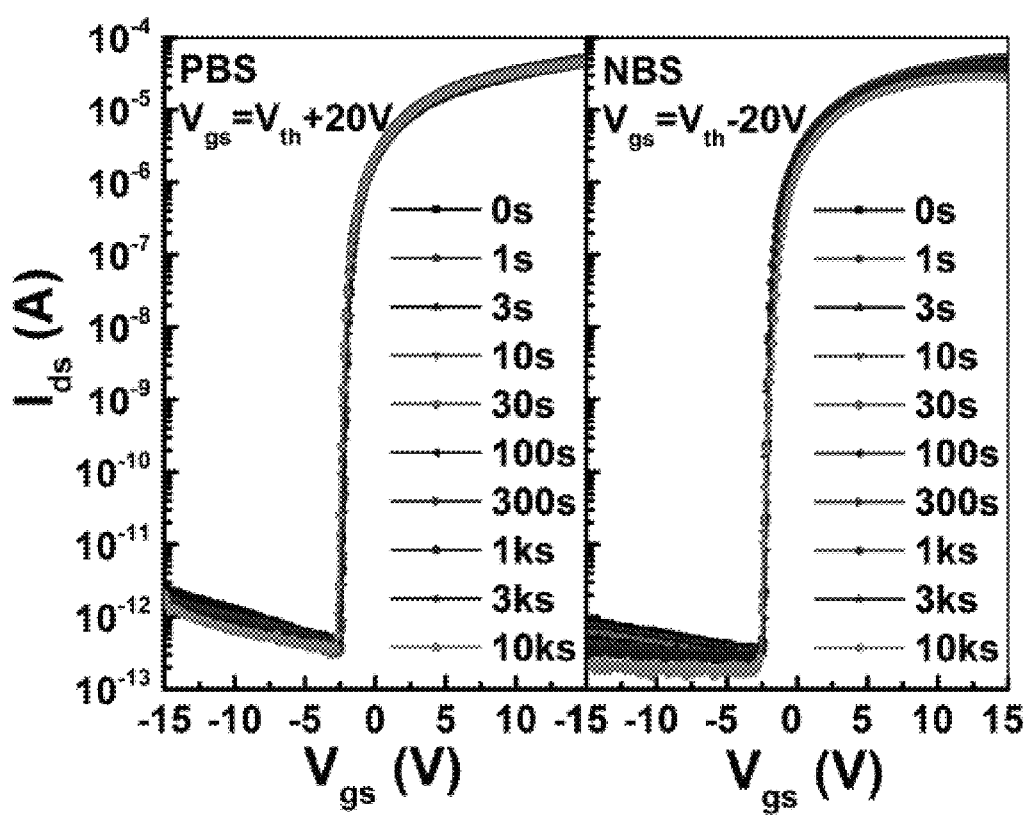
FIG. 8 is a transfer characteristic curve graph obtained by testing positive and negative grid-bias stresses of the TG-SA ITZO TFT manufactured in Embodiment 2 of the present disclosure.

FIG. 8 shows results of a PBS (positive bias stress) test and a NBS (negative bias stress) test of the TG-SA ITZO TFT manufactured in Embodiment 2. It can be seen from FIG. 8 that the transfer curve of a device is not changed significantly after a 10000-second stress test. However, after the same stress test, a threshold voltage drift of the device in the document 1 reaches more than 1.4 V, which indicates that the stability of the TFT of the present disclosure is good.

The foregoing specifically describes the preferred embodiments of the present disclosure, but the present disclosure is not limited to the embodiments, those skilled in the art may make various equal deformations or replacements without deviating from the spirit of the present disclosure, and these equal deformations or replacements are included in the scope limited by the claims of the application.

The invention claimed is:

1. A method for manufacturing a top-gate self-aligned ITZO thin-film transistor, comprising:
   depositing a buffer layer on a substrate;
   depositing an ITZO thin film on the buffer layer;
   patterning and etching the ITZO thin film to obtain a patterned ITZO thin film;
   depositing a gate dielectric layer on the patterned ITZO thin film by using a first chemical vapor deposition method, wherein a precursor used in the first chemical vapor deposition method comprises alkoxysilane or a mixed gas source of alkoxysilane and inert gas, and a first oxidizing gas source;
   depositing a conductive thin film on the gate dielectric layer, and patterning and etching the conductive thin film to obtain a patterned conductive thin film; etching the gate dielectric layer by using the patterned conductive thin film as a mask, and performing first annealing;
   depositing a passivation layer on the conductive thin film and the ITZO thin film by using a second chemical vapor deposition method, wherein a gas source used in the second chemical vapor deposition method comprises a silane gas source or a mixed gas source of silane and inert gas, and a second oxidizing gas source;
   patterning and etching the passivation layer to form contact holes of a source, a drain and a gate; and
   forming source and drain contact electrodes and a gate contact electrode in the contact holes of the source, the drain and the gate, and performing second annealing.

2. The method for manufacturing the top-gate self-aligned ITZO thin-film transistor according to claim 1, wherein the first oxidizing gas source is $O_2$, $O_3$, $N_2O$ or a mixed gas containing oxygen.

3. The method for manufacturing the top-gate self-aligned ITZO thin-film transistor according to claim 1, wherein the alkoxysilane is trimethoxysilane, ethyl orthosilicate, triethoxysilane or tetramethyl silicate.

4. The method for manufacturing the top-gate self-aligned ITZO thin-film transistor according to claim 1, in the first annealing, wherein an annealing atmosphere is a gas containing oxygen, an annealing temperature ranges from 100° C. to 400° C., and the annealing lasts for 1 hour to 4 hours.

5. The method for manufacturing the top-gate self-aligned ITZO thin-film transistor according to claim 1, in the second annealing, wherein an annealing atmosphere is a gas containing oxygen, an annealing temperature ranges from 100° C. to 400° C., and the annealing lasts for 0.1 hour to 2 hours.

6. The method for manufacturing the top-gate self-aligned ITZO thin-film transistor according to claim 1, wherein the specific step of depositing the ITZO thin film on the buffer layer is:
   depositing the ITZO thin film on the buffer layer by using a magnetron sputtering method, wherein the magnetron sputtering method is a DC magnetron sputtering method and/or a RF magnetron sputtering method; an ITO target material and a ZnO target material are used as target materials in the magnetron sputtering method; and a temperature of the substrate during the reaction ranges from 23° C. to 400° C.

7. The method for manufacturing the top-gate self-aligned ITZO thin-film transistor according to claim 6, wherein the second oxidizing gas source is O2, O3, N2O or a mixed gas containing oxygen.

* * * * *